United States Patent
Matsumoto et al.

(10) Patent No.: US 6,765,838 B2
(45) Date of Patent: Jul. 20, 2004

(54) REFRESH CONTROL CIRCUITRY FOR REFRESHING STORAGE DATA

(75) Inventors: Junko Matsumoto, Hyogo (JP); Tadaaki Yamauchi, Hyogo (JP); Takeo Okamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/209,901

(22) Filed: Aug. 2, 2002

(65) Prior Publication Data
US 2003/0081485 A1 May 1, 2003

(30) Foreign Application Priority Data
Oct. 29, 2001 (JP) .................................... 2001-330951

(51) Int. Cl.$^7$ ................................................. G11C 7/00
(52) U.S. Cl. .................... 365/222; 365/230.06; 365/236
(58) Field of Search ................................ 365/222, 203, 365/230.06, 230.08, 230.03, 236

(56) References Cited

U.S. PATENT DOCUMENTS

| | | | | |
|---|---|---|---|---|
| 5,243,576 A | * | 9/1993 | Ishikawa | 365/222 |
| 5,446,695 A | * | 8/1995 | Douse et al. | 365/222 |
| 5,877,978 A | * | 3/1999 | Morishita et al. | 365/149 |
| 5,969,981 A | * | 10/1999 | Kono | 365/145 |
| 6,307,776 B1 | * | 10/2001 | So et al. | 365/185.03 |
| 6,542,425 B2 | * | 4/2003 | Nam | 365/222 |

* cited by examiner

*Primary Examiner*—Gene Auduong
(74) *Attorney, Agent, or Firm*—McDermott, Will & Emery

(57) ABSTRACT

A refresh array activating signal is activated in accordance with a refresh request and specific address bit(s) of a refresh address. Specific lower bit(s) of a refresh address counter is (are) utilized as the specific address bit(s) of the refresh address, and the specific address bit(s) is (are) utilized as upper bit(s) of the refresh address. Thus, in the self-refresh mode, refresh can be performed for a prescribed address region at uniform intervals, with a lengthened refresh interval, consuming less current. A semiconductor memory device is provided which allows current consumption to be distributed on a time basis and to be reduce in a self-refresh mode is provided.

12 Claims, 9 Drawing Sheets

: PHY IS ISSUED AT THE SAME
  PERIOD IN 4K REFRESH AND
  8K REFRESH

REFRESH CONTROL CIRCUITRY FOR REFRESHING STORAGE DATA

BACKGROUND OF THE INVENTION

1. Field of the Invention

The present invention relates to semiconductor memory devices, and particularly to a configuration of a refresh control circuitry for restoring storage data of dynamic type memory cells in prescribed periods for retention of the storage data. More specifically, the present invention relates to a configuration for reducing current consumption in a self-refresh mode where storage data of a memory cell is internally refreshed periodically.

2. Description of the Background Art

Semiconductor memory devices include a dynamic random access memory (DRAM) storing information in a capacitor in an electrical charge form. A DRAM cell is normally formed of an access transistor and a capacitor. Compared to a static random access memory (SRAM) cell, a unit memory cell of the DRAM is low in cost per bit, and small in layout area and in the number of components thereof Therefore, the DRAM can implement a memory device with small occupying area and large storage capacity at a low price, so that DRAMs are widely used in a variety of applications, such as a main memory.

A DRAM cell stores information in an electrical charge form in a capacitor, as described above. Inevitably, there is a possibility that the stored information would be lost due to a leakage current at the capacitor. In order to retain the stored information, refreshing is performed, in which data stored in a memory cell is read out and rewritten periodically. There are two operation modes for carrying out the refresh. One is an auto-refresh mode, in which a refresh address is internally produced to refresh the storage data at an address designated by the refresh address according to an externally supplied refresh instruction, in a normal operation mode during which data access is performed. The other is a self-refresh mode, in which the refresh is carried out by internally generating a refresh execution timing and a refresh address. The self-refresh mode is set, for example, in a sleep mode in which no data access is made to the DRAM over a relatively long period of time. In this self-refresh mode, the DRAM is required only to retain data.

If a DRAM is applied to battery-driven equipment such as portable equipment, the current consumption should be limited to a minimum level to elongate the life of the battery. Especially in the self-refresh mode with the entire equipment being in standby, the current consumption should be made as small as possible. In the self-refresh mode, row selection of memory cells and reading/rewriting of memory cell data are performed according to a refresh address. Thus, a current is consumed in the self-refresh mode in execution of the refresh operation.

SUMMARY OF THE INVENTION

An object of the present invention is to provide a semiconductor memory device permitting considerable reduction of current consumption in a self-refresh mode without a complicated circuit configuration.

The semiconductor device according to the present invention includes refresh address generating circuitry for generating a multi-bit refresh address designating a memory cell to be refreshed, and refresh activating circuitry for generating a refresh array activating signal for activating a refresh operation in accordance with a specific address bit of the refresh address and a refresh request.

In the refresh mode, when the specific address bit of the refresh address is in a specific state, the refresh request is invalidated so as to lengthen a refresh interval without a change of a period of an issuance of the refresh request by the timer. Accordingly, the number of times of refresh per unit time in the self-refresh mode, and hence, current consumption in the self-refresh mode can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Overall Configuration]

Figure 1:
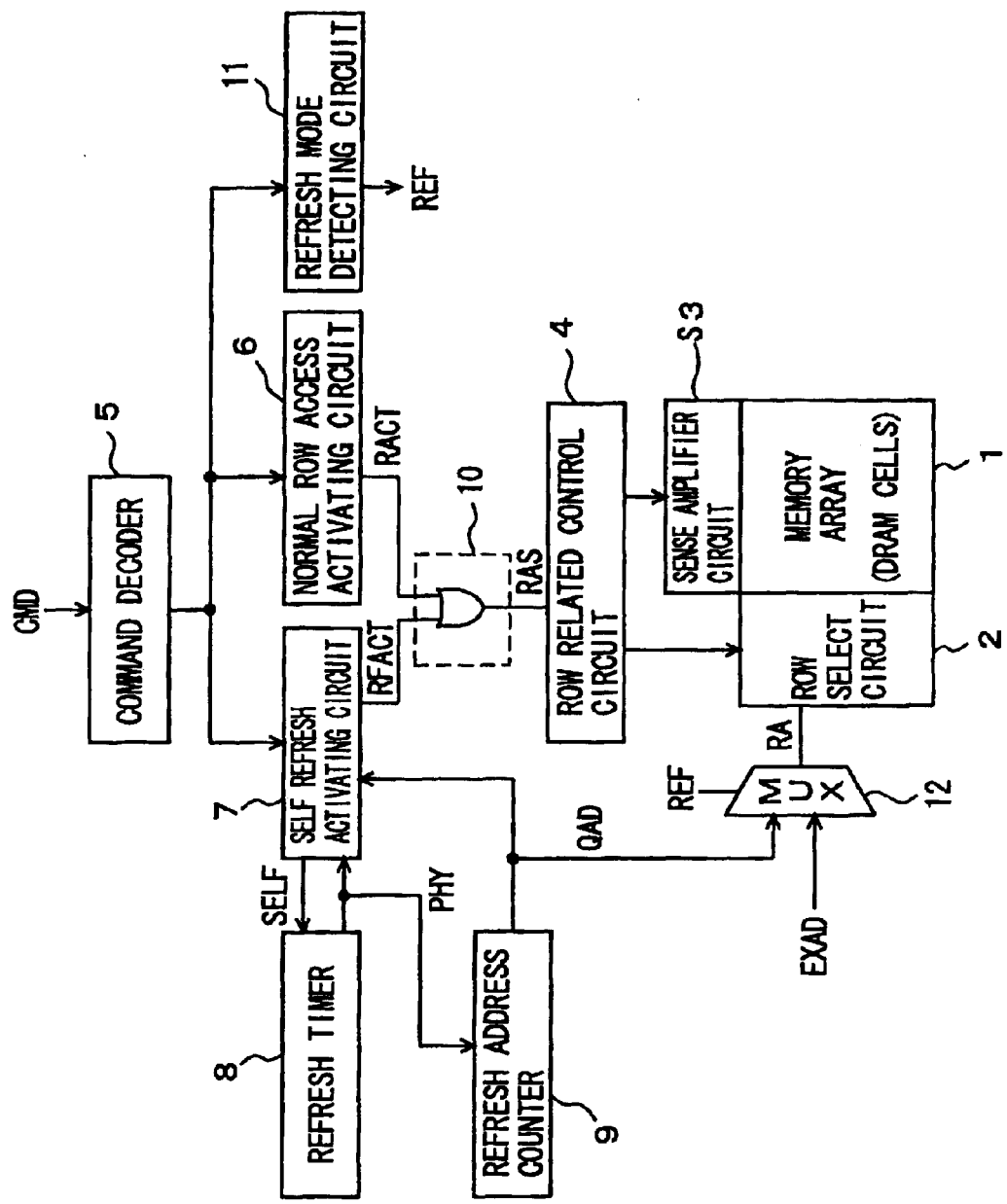
FIG. 1 schematically shows a configuration of the main portion of a semiconductor memory device according to the present invention.

FIG. 1 schematically shows a configuration of the main portion of the semiconductor memory device according to the present invention. Specifically, the configuration of a portion associated with refresh is schematically shown in FIG. 1.

Referring to FIG. 1, the semiconductor memory device includes: a memory array 1 having a plurality of DRAM cells arranged in rows and columns; a row select circuit 2 which selects an addressed row in memory array 1 according to a received address signal; a sense amplifier circuit 3 which performs sensing, amplification and rewriting (restoring) of data in the memory cells on the selected row of memory array 1; a row related control circuit 4 which activates and inactivates row select circuit 2 and sense amplifier circuit 3 in a predetermined sequence according to a row select instructing signal RAS; a command decoder 5 which decodes an externally supplied command CMD designating an operation mode and generates an operation mode designating signal specifying the designated operation mode; a normal row access activating circuit 6 which activates a normal mode array activating signal RACT according to a normal row access instructing signal from command decoder 5; a refresh activating circuit 7 which activates a refresh array activating signal RFACT at a predetermined interval according to a self-refresh mode instructing signal from command decoder 5; a refresh timer 8 which is activated upon activation of a self refresh instructing signal SELF from refresh activating circuit 7 and issues a refresh request PHY at predetermined intervals; and a refresh address counter 9 which performs a counting operation according to refresh request PHY from refresh timer 8 and generates a refresh address designating a refresh row.

When a specific bit of the refresh address from refresh address counter 9 is at a predetermined logical level, even though refresh request PHY is issued, refresh activating circuit 7 ignores the issued refresh request PHY, and stops issuance (activation) of refresh array activating signal RFACT.

Normal row access activating circuit 6 activates normal mode array activating signal RACT when external command CMD designates a mode of selecting a row in memory array 1. Further, normal row access activating circuit 6 activates the normal array activating signal RACT for a predetermined time period upon application of an auto-refresh instruction instructing refresh from command decoder 5.

The semiconductor memory device further includes: a row select activating circuit 10 which generates a row select designating signal RAS for application to row related control circuit 4 in accordance with refresh array activating signal RFACT from the self refresh activating circuit 7 and normal mode array activating signal RACT from normal row access activating circuit 6; a refresh mode detecting circuit 11 which generates a refresh mode instructing signal REF according to the self-refresh mode designation or auto-refresh mode designation from command decoder 5; and a multiplexer (MUX) 12 which selects either a refresh address QAD from refresh address counter 9 or an external address EXAD for application to row select circuit 2 in accordance with refresh mode designating signal REF from refresh mode detecting circuit 11.

Row select activating circuit 10 is formed of an OR circuit, for example, and activates row select instructing signal RAS upon activation of either refresh array activating signal RFACT or normal mode array activating signal RACT. Thus, in the case of an auto-refresh mode where the refresh instruction is externally supplied in a normal operation mode, a row in memory array 1 is selected according to refresh address QAD output from refresh address counter 9 in response to the external auto-refresh command, and refresh of data stored in the selected memory cells is carried out.

In the case of the self-refresh mode, self refresh activating circuit 7 stops issuance of refresh array activating signal RFACT at the time when a specific address bit of refresh address QAD output from refresh address counter 9 is at a predetermined logical level, despite issuance of refresh request PHY by refresh timer 8. Thus, a refresh row is selected at an interval that is longer than the issuance interval of refresh request PHY by refresh timer 8.

In the self-refresh mode, refresh requests PHY output from refresh timer 8 are equivalently thinned out to stop refresh operations, to decrease the number of times of refresh to be carried out during the self-refresh mode is decreased, which reduces the number of times of operations of the circuitry related to the refresh, and hence current consumption in the self-refresh mode.

In stopping the refreshing operation, issuance of refresh array activating signal RFACT is stopped when a specific address bit of refresh address QAD from refresh address counter 9 is at a predetermined logical level, and a refresh address region designated by the specific refresh address bit is not refreshed. Data is retained only in a limited region in the self-refresh mode. Such limitation, however, causes no problem, since data that should be retained in a normal use is limited to processed data or the like.

First Embodiment

Figure 2:
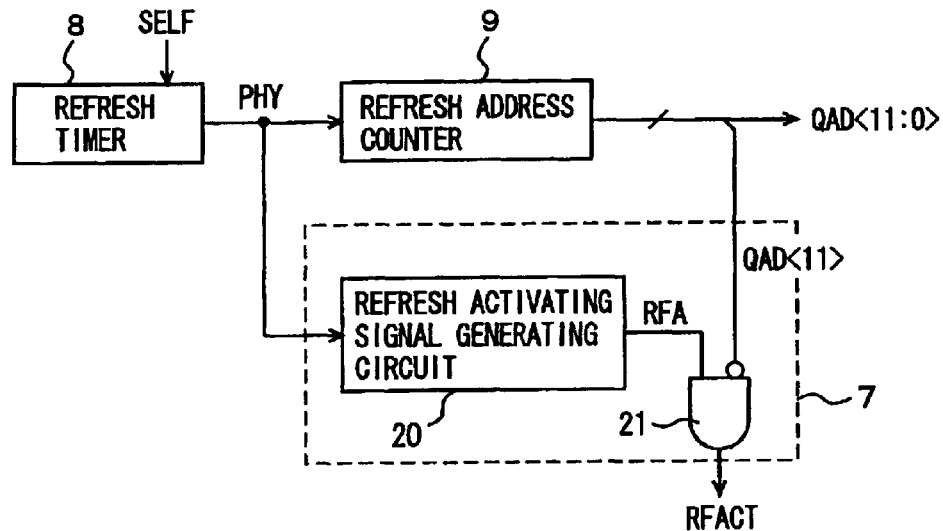
FIG. 2 schematically shows a configuration of a refresh activating circuit according to a first embodiment of the present invention.

FIG. 2 schematically shows a configuration of self refresh activating circuit 7 according to the first embodiment of the present invention. Hereinafter, it is assumed, for simplification of explanation, that refresh address counter 9 generates refresh address QAD<11:0> of 12 bits, and memory array 1 has 4 K rows arranged therein.

Referring to FIG. 2, refresh address counter 9 updates its count value in accordance with refresh request PHY from refresh timer 8, and generates 12-bit refresh address QAD<11:0> in accordance with the count value.

Refresh activating circuit 7 includes: a refresh activating signal generating circuit 20 which generates an activation control signal RFA having a prescribed pulse width in accordance with refresh request PHY from refresh timer 8; and a gate circuit 21 which generates refresh array activating signal RFACT in accordance with activation control signal RFA from refresh activating signal generating circuit 20 and a most significant refresh address bit QAD<11>.

Refresh activating signal generating circuit 20 is formed of a one-shot pulse generating circuit, for example, and generates a one-shot pulse signal having a prescribed time width in response to a rise of refresh request PHY to activate activation control signal RFA. Refresh address counter 9 increments its count value by 1 at each issuance of refresh request PHY, after completion of the refresh operation, for example.

Gate circuit 21 generates refresh array activating signal RFACT in accordance with activation control signal RFA in the case where the most significant refresh address bit QAD<11> is at an L level. If this bit QAD<11> is at an H level, gate circuit 21 maintains refresh array activating signal RFACT at an L level of an inactive state.

Figure 3:
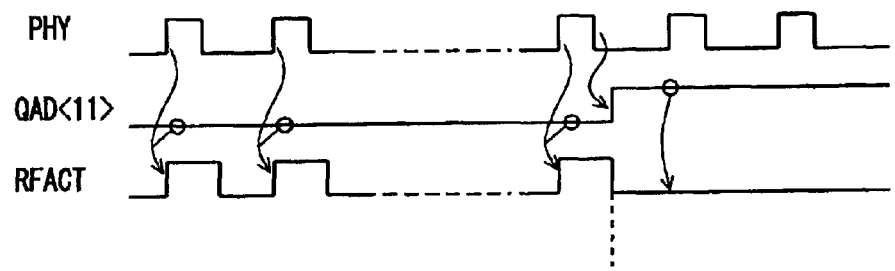
FIG. 3 is a timing chart representing an operation of the circuit shown in FIG. 2.

FIG. 3 is a timing chart representing the operation of refresh activating circuit 7 shown in FIG. 2. When most significant refresh address bit QAD<11> is at an L level, refresh is carried out as refresh array activating signal RFACT is activated in response to refresh request PHY. Once most significant refresh address bit QAD<11> attains an H level, refresh array activating signal RFACT is kept at the inactive state even if refresh request PHY is issued.

During the time period in which most significant refresh address bit QAD<11> is at an H level, refresh address counter 9 performs the counting operation in accordance with refresh request PHY from refresh timer 8. Thus, in the address region designated by refresh address QAD<11:0> generated by refresh counter 9, refresh is carried out for a half of the address region in which refresh address bit QAD<11> is at an L level, while no refresh is performed for the remaining half of the address region.

Figure 4:
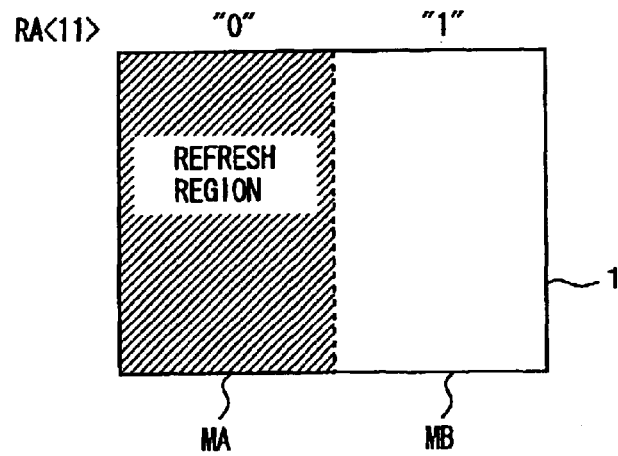
FIG. 4 schematically shows a refresh address region in the circuit shown in FIG. 2.

FIG. 4 schematically shows address assignment for memory array 1. Memory array 1 is divided into two regions MA and MB in accordance with the most significant row address bit RA<11>. Region MA corresponds to a region where most significant row address bit RA<11> is "0", while region MB is a region with most significant row address bit RA<11> being "1". In a refresh mode, this row address bit RA<11> is provided by refresh address bit QAD<11>. Thus, data stored in the memory cells within region MA are refreshed, while refresh is not performed for memory block MB in the self-refresh mode.

Normally, in portable terminal equipment or the like, it is unnecessary to refresh every information stored in the entire address region of memory array 1. For example, data downloaded from the Internet to a portable telephone is saved in a non-volatile memory. Data processing requiring retention of the result is carried out merely in a part of the address region of the memory array. Therefore, the refresh performed only on the half region MA of memory array 1 to retain storage data in the self-refresh mode will be sufficient for retention of necessary data.

Since the address region to be refreshed in the self-refresh mode is halved as described above, the effective refresh interval is doubled, resulting in reduction of current consumption during the self-refresh mode.

If most significant two bits of refresh address are used for control of the refresh operation, only one of quadrisect regions of memory array 1 defined by the two bits of the refresh address (or row address) is refreshed. Thus, the refresh interval can be equivalently quadrupled, leading to further reduction of current consumption during the self-refresh mode.

Such control of execution of a refresh operation using a plurality of bits of the refresh address enables refresh of only a desired region of the memory array. As a result, the refresh interval can be lengthened, and current consumption in the self-refresh mode can be reduced. The refresh interval is lengthened simply by effectively modifying the refresh requests to thin out the opportunities of activation of the refresh activating signal, and the issuance interval of refresh requests PHY by refresh timer 8 is set fixedly. Accordingly, the refresh interval can be altered without changing the configuration of refresh timer 8.

Refresh address counter 9 performs the counting operation in accordance with refresh request PHY from refresh timer 8. Integrity of the refresh addresses in the auto-refresh mode performed in the normal operation mode and the self-refresh mode can be maintained.

It is also possible in the self-refresh mode to realize a refresh cycle the same as in the normal auto-refresh mode in which refresh is executed in accordance with an externally supplied refresh instruction. This ensures retention of the memory cell data in the self-refresh mode, as will now be described.

As an example, it is considered the case where the memory device enters the self-refresh mode when an external auto-refresh command is supplied and refresh is carried out for a row in region MB of the same address RA<10:0> as a row of interest in region MA shown in FIG. 4. In this case, the row of interest is refreshed after all the remaining rows in regions MA and MB are addressed sequentially. Thus, refresh request PHY is issued 4K times before the refresh of the row of interest, and the refresh interval of the row of interest coincides with the refresh interval when refresh is carried out according to an external auto-refresh instruction. Thus, data retention is more ensured than in the case employing a fixed most significant refresh address bit to double the refresh interval, as described below.

Now, it is assumed that, in the self-refresh mode, the most significant refresh address bit QAD<11> is set to an L level ("0") to fixedly designate region MA, and the issuance period of the refresh timer is set twice the refresh interval in the normal, auto-refresh mode. Provided that the row of interest in region MA is refreshed under the same conditions as described above, the memory devices enters the self-refresh mode after elapse of 2K·16 $\mu$s from the auto refresh of the row of interest. In the self-refresh mode, because a next row is designated as a target row of refreshing, the row of interest is refreshed after the remaining 2K rows in region MA is refreshed, or after a lapse of 2K·16·2 $\mu$s. That is, the row of interest is refreshed after a lapse of 2K·16 $\mu$s+16·2·2K $\mu$s in this state. Accordingly, the refresh cycle time of the row of interest becomes 32+64 ms, which is 1.5 times the normal refresh cycle of 64 ms, and data retention performance cannot be ensured.

However, even if the refresh interval is doubled in the self-refresh mode, the refresh interval of each refresh row in the data retaining region can be made the same as in the normal operation mode by setting the issuance interval of the refresh request equal to the refresh period in the normal operation mode, as in the present embodiment, which ensures reliable data retention.

As described above, according to the first embodiment of the present invention, a region to be refreshed is limited to a specific address region in the self-refresh mode. The refresh interval in the self-refresh mode can be lengthened, and consequently, current consumption during the self-refresh mode can be reduced.

The execution of refresh is controlled by simply using a specific bit of the refresh address. Accordingly, it is readily possible to set the refresh region and the refresh interval with a simple circuit configuration.

Second Embodiment

Figure 5:
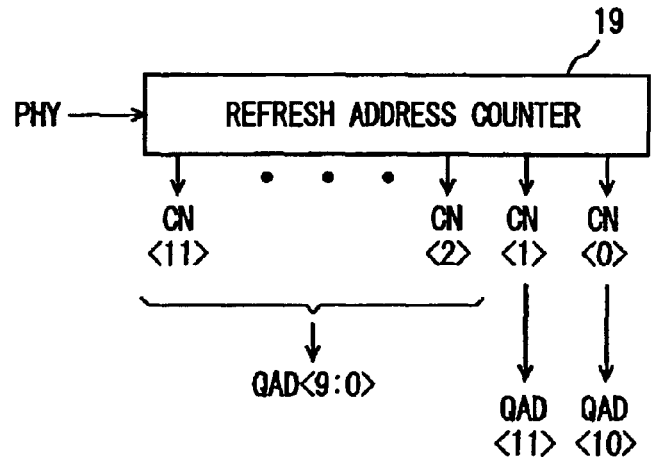
FIG. 5 schematically shows a correspondence relationship of count bits of a refresh address counter to a refresh address according to a second embodiment of the present invention.

FIG. 5 schematically shows a configuration of the refresh address counter according to the second embodiment of the present invention. Referring to FIG. 5, the refresh address counter 19 counts refresh request PHY and expresses the counter value as a count CN<11:0> of 12 bits. The least significant count bit CN<0> is used as the refresh address bit QAD<10>, the second least significant bit CN<1> as the most significant refresh address bit QAD<11>, and the remaining count bits CN<11:2> are used as the refresh address bits QAD<9:0>. Thus, in refresh address counter 19 of such a configuration, the value of refresh address bit QAD<10> changes at each issuance of refresh request PHY, and the value of the most significant refresh address bit QAD<11> changes at alternate issuance of refresh request PHY.

Figure 6:
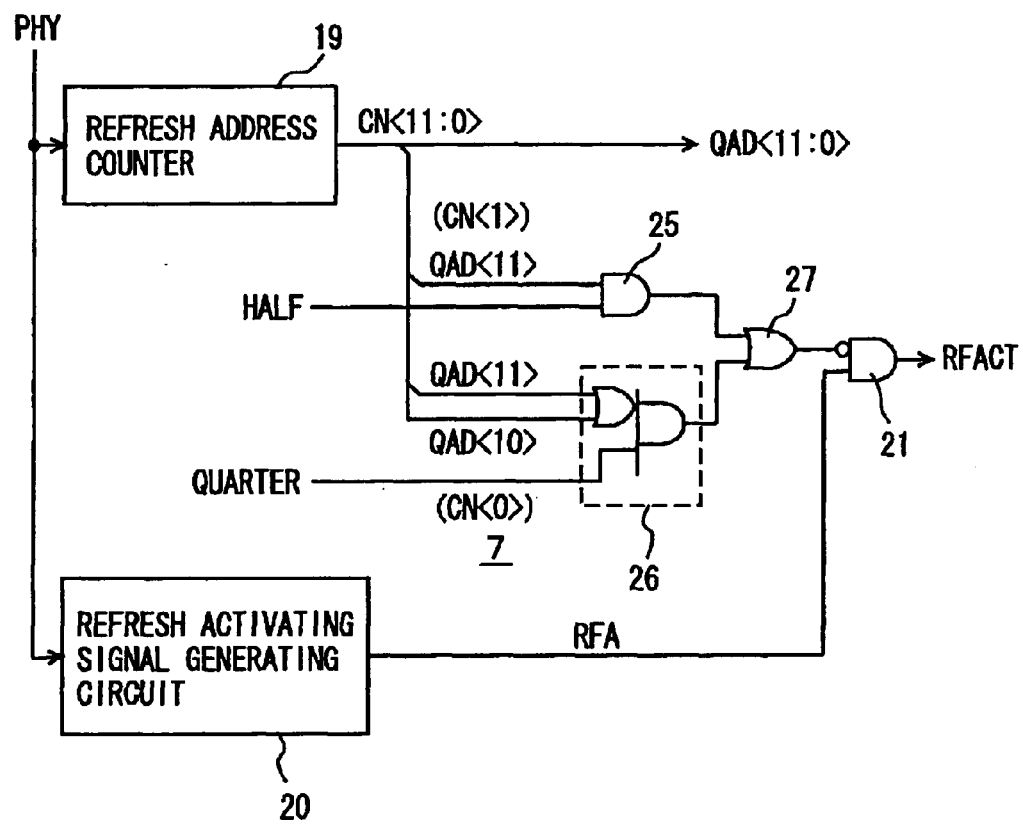
FIG. 6 schematically shows a configuration of a refresh activating circuit according to the second embodiment.

FIG. 6 schematically shows a configuration of refresh activating circuit 7 according to the second embodiment. Referring to FIG. 6, refresh activating circuit 7 includes: an AND gate 25 which receives the most significant refresh address bit QAD<11> corresponding to the second least significant count bit of refresh address counter 19 and a half mode designating signal HALF; and a composite gate 26 which receives least significant two bits of count value of refresh address counter 19 as refresh address QAD<11:10> and further receives a quarter mode designating signal QUARTER.

Composite gate 26 equivalently includes an OR gate which receives refresh address bits QAD<11> and QAD<10>, and an AND gate which receives an output signal of the OR gate and quarter mode designating signal QUARTER.

Refresh activating circuit 7 further includes: an OR gate 27 which receives an output signal of AND gate 25 and an output signal of composite gate 26; and a gate circuit 21 which receives an output signal of OR gate 27 and an output signal RFA of refresh activating signal generating circuit 20 to generate refresh array activating signal RFACT.

Refresh activating signal generating circuit 20 generates a pulse signal having a prescribed time width as activation control signal RFA in response to refresh request PHY. Gate circuit 21 generates, when the output signal of OR gate 27 is at an L level, refresh array activating signal RFACT in response to activation control signal RFA.

Half mode designating signal HALF and quarter mode designating signal QUARTER may be set in a mode register using a command, for example, and alternatively, their voltage levels may be set in a fixed manner by mask interconnection or bonding pad. When half mode designating signal HALF is at an H level, refresh is carried out for a half area of the entire address region. In the quarter mode, a quarter area of the entire address region is refreshed.

Figure 7:
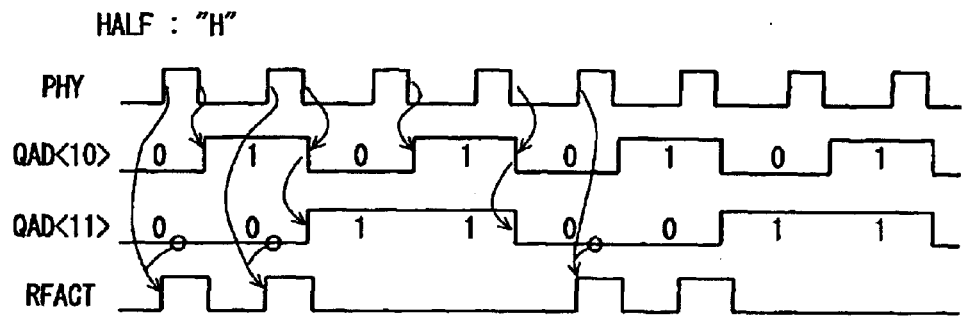
FIG. 7 is a timing chart representing an operation of the circuit shown in FIG. 6 in a half mode.

FIG. 7 is a timing chart representing the operation of the refresh activating circuit in the half mode. Now, the operation of the refresh activating circuit 7 in the half mode will be described with reference to FIG. 7.

In the half mode, half mode designating signal HALF is at an H level, and quarter mode designating signal QUARTER is at an L level. In this state, the output signal of composite gate 26 shown in FIG. 6 is at an L level. AND gate 25 has its output signal changed in accordance with refresh address bit QAD<11> (count bit CN<1>). Thus, count value CN<11:0> of refresh address counter 19 is incremented by 1 every time refresh request PHY is issued.

Most significant refresh address bit, QAD<1>, corresponding to the second least significant count bit CN<1>, has its bit value changed at every other issuance of refresh request PHY. The output signal of OR gate 27 attains an L level when refresh address bit QAD<11> is at an L level. Thus, gate circuit 21 generates refresh array activating signal RFACT in accordance with activation control signal RFA from refresh activating signal generating circuit 20 when the output signal of OR gate 27 is at an L level, i.e., when refresh address bit QAD<11> is at an L level.

Accordingly, in the half mode, refresh is carried out at every other issuance of the refresh request, which enables uniform distribution of the refresh execution cycles in the self-refresh mode, and hence, uniform distribution of current consumption per unit time. Further, the refresh interval can be doubled equivalently.

In this half mode, regions MA and MB shown in FIG. 4 are addressed alternately every time refresh request PHY is issued. Thus, a memory cell in region MA is refreshed at every 4K refresh execution cycles. Accordingly, as in the first embodiment, data in the memory cells are refreshed at the same refresh cycle as in the normal operation mode, so that retention of the data is ensured.

Figure 8:
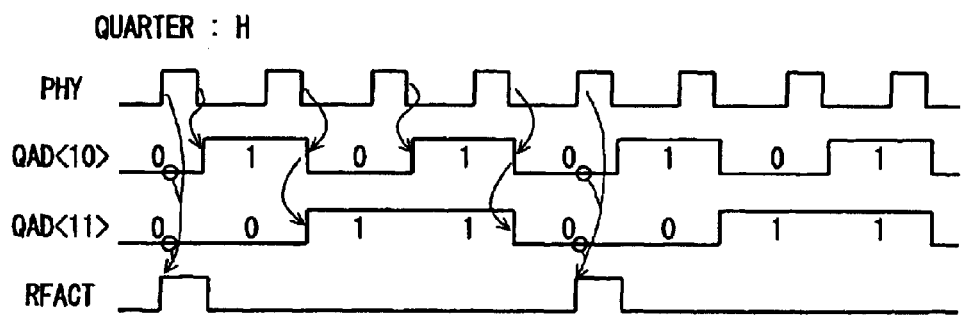
FIG. 8 is a timing chart representing the operation of the circuit shown in FIG. 6 in a quarter mode.

FIG. 8 is a timing chart representing the operation of the refresh activating circuit shown in FIG. 6 in the quarter mode. Now, the operation of the refresh activating circuit in FIG. 6 in the quarter mode will be described with reference to FIG. 8.

In the quarter mode, quarter mode designating signal QUARTER is set at an H level, and half mode designating signal HALF is set at an L level. In this state, the output signal of AND gate 25 is fixed at an L level, and composite gate 26 outputs a signal of an L level when address bits QAD<11:10>, i.e., the count bits CN<1:0>, are both at an L level. Thus, gate circuit 21 generates refresh array activating signal RFACT in response to refresh request PHY at the time when refresh address bits QAD<11:10> are both "0".

Figure 9:
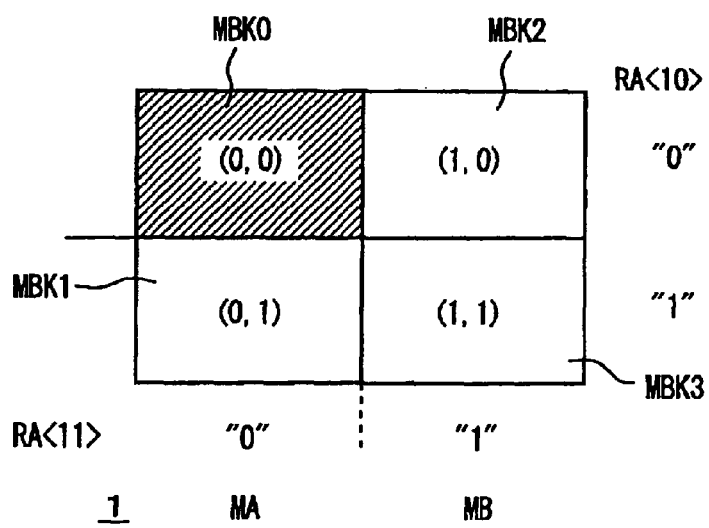
FIG. 9 schematically shows a refresh region in the quarter mode.

Accordingly, in the quarter mode, the refresh interval can be set four times as long as in the normal operation mode. In this case, as shown in FIG. 9, refresh is carried out for a region MBK0 in the memory array assigned with address bits RA<11> and RA<10> both being "0". In this case as well, the actual refresh interval of each memory cell to be refreshed is the same as in the normal operation mode, since the refresh interval is equivalently quadrupled compared to that in the normal operation mode. Accordingly, the memory cells are refreshed at a refresh period identical to the one for the auto refresh in the normal operation mode, and therefore, retention of the stored data in the memory cells is also guaranteed in this quarter mode.

In FIG. 9, memory array 1 is divided into four regions MBK0–MBK3 having row addresses RA<11:10> of (0, 0), (0, 1), (1, 0) and (1, 1), respectively. Thus, by changing the logic level of refresh address bits QAD<11:10> supplied to composite gate 26, any one of the four divided regions MBK0–MBK3 can be used as a data retaining region.

The count value of refresh address counter 19 is incremented by 1 every time refresh request PHY is issued in the description above. Alternatively, the count may be decremented by 1 at each issuance of refresh request PHY. In this case, refresh address bit QAD<11> has its logical level changed every time refresh address bit QAD<10> rises to "1".

Modification

Figure 10:
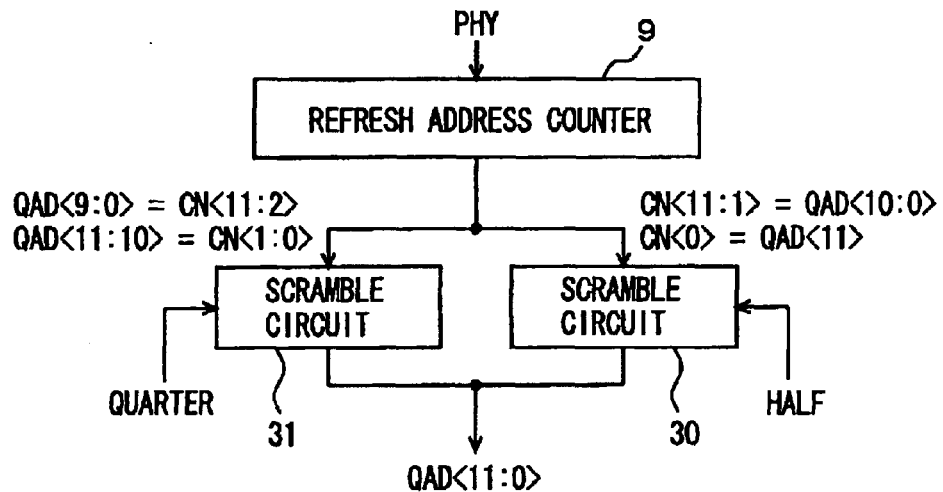
FIG. 10 schematically shows a configuration of a modification of the second embodiment of the present invention.

FIG. 10 schematically shows a configuration of the refresh address generating unit according to a modification of the second embodiment. Referring to FIG. 10, the refresh address generating unit includes: a refresh address counter 9 which has its count value incremented by 1 in accordance with refresh request PHY; a scramble circuit 30 which outputs the least significant count bit CN<0> of refresh address counter 9 as the most significant refresh address bit QAD<11> and outputs the remaining count bits CN<11:1> as the remaining refresh address bits QAD<10:0>; and a scramble circuit 31 which outputs least significant two address bits CN<1:0> as most significant two refresh address bits QAD<11:10> and outputs the remaining count bits CN<11:2> as the remaining refresh address bits QAD<9:0>.

Scramble circuit 30 is activated upon activation of half mode designating signal HALF, and scrambles the count bits of refresh address counter 9. According to the scrambling, the least significant count bit CN<0> is output as the most significant refresh address bit QAD<11>, and the remaining count bits CN<11:1> are output as refresh address bits QAD<10:0>.

Scramble circuit 31 outputs, upon activation of quarter mode designating signal QUARTER, least significant two count bits CN<1:0> of refresh address counter 9 as most significant two refresh address bits QAD<11:10>, and the remaining upper count bits CN<11:2> as refresh address bits QAD<9:0>.

These scramble circuits 30 and 31 are each formed of, e.g., tri-state buffer circuits. Connection paths of the count bits of refresh address counter 9 are switched by means of interconnection lines, and the tri-state buffer at the output stage are activated in accordance with either half mode designating signal HALF or quarter mode designating signal QUARTER. Refresh address bits QAD<11:0> of scramble circuits 30 and 31 are used as output counts CN<11:0> of refresh address counter 19 shown in FIG. 6.

Figure 11:
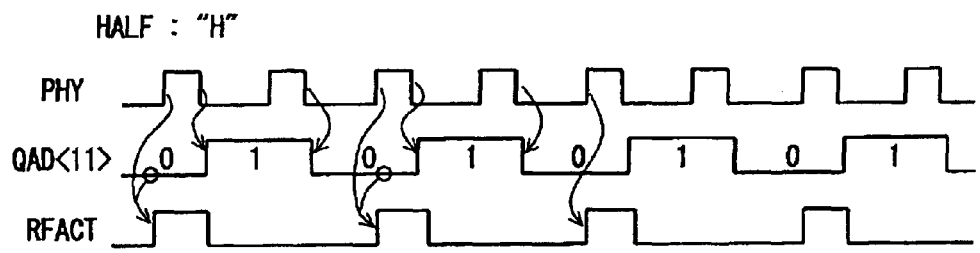
FIG. 11 is a timing chart representing an operation when a refresh address generating unit shown in FIG. 10 is employed.

FIG. 11 is a timing chart representing the operation of the refresh address generating unit shown in FIG. 10 in the half mode. Now, the operation of the refresh activating circuit in the half mode will be described with reference to FIG. 11.

Refresh address counter 9 increments its count value by 1 in accordance with refresh request PHY. In the half mode, the least significant count bit CN<0> is used as the most significant refresh address bit QAD<11>, and the logical level of the most significant refresh address bit QAD<11> changes at each issuance of the refresh request.

Since AND gate 25 shown in FIG. 6 outputs a signal of an L level when most significant refresh address bit QAD<11> is at an L level, refresh array activating signal RFACT is issued, in response to refresh request PHY, at the time when the most significant refresh address bit QAD<11> is "0". That is, refresh array activating signal RFACT is issued at every other issuance of refresh request PHY.

Thus, utilizing the least significant bit of refresh address counter 9 as the most significant refresh address bit QAD<11>, as shown in FIG. 11, brings about uniform refresh intervals, and hence, more uniform current consumption during the self-refresh mode.

Refresh array activating signal RFACT is activated in the quarter mode in the same sequence as illustrated in FIG. 8.

In the configuration shown in FIG. 6, refresh array activating signal RFACT is generated in accordance with activation control signal RFA from refresh activating signal generating circuit 20 and a predetermined refresh address bit (or count bit). Alternatively, the input of refresh activating signal generating circuit 20 may be provided with a configuration which enables thinning out of issuance of refresh request PHY in accordance with a count bit of refresh address counter 19 or 9.

As described above, according to the second embodiment of the present invention, the refresh requests are selectively invalidated in the refresh mode in accordance with a prescribed bit of the refresh address. This enables lengthening of the refresh execution interval, while the refresh interval of the memory cells is kept the same as in the normal operation mode. The refresh execution cycles, and hence current consumption, can be distributed in time basis over the self-refresh mode. Accordingly, even in the case where the self-refresh mode is set only for half of a refresh cycle, current consumption during the self-refresh mode can be reduced.

Third Embodiment

Figure 12:
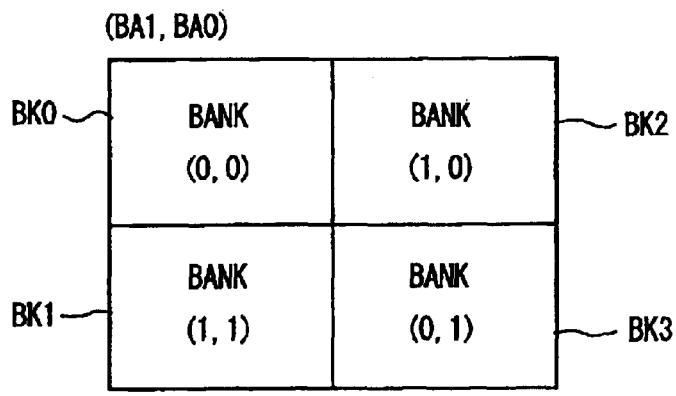
FIG. 12 schematically shows a configuration of a memory array according to a third embodiment of the present invention.

FIG. 12 schematically shows a configuration of the memory array according to the third embodiment of the present invention. Referring to FIG. 12, memory array 1 is divided into four banks BK0–BK3 each identified by a bank address of two bits (BA1, BA0). Specifically, bank addresses (0, 0), (1, 1), (1, 0) and (0, 1) are assigned to respective banks BK0–BK3. In the present embodiment, two banks are refreshed simultaneously in the self-refresh mode.

Figure 13:
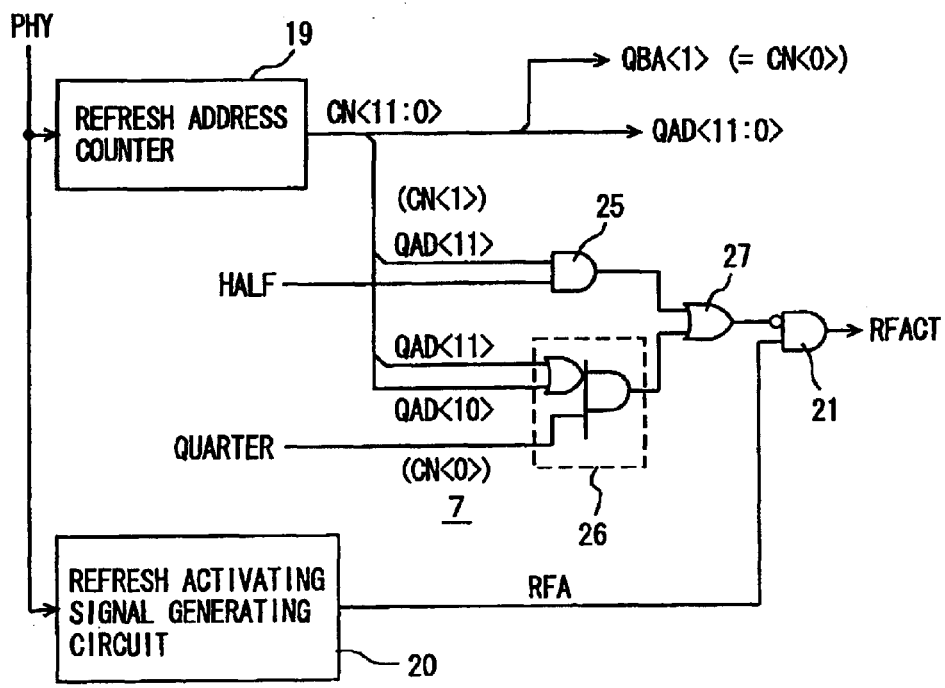
FIG. 13 schematically shows configurations of a refresh address generating unit and a refresh activating circuit according to the third embodiment.

FIG. 13 shows configurations of the refresh activating circuit and the refresh address generating unit according to the third embodiment. In the refresh address generating unit shown in FIG. 13, the least significant count bit CN<0> from refresh address counter 19 is used as both a refresh bank address QBA<1> and refresh address bit QAD<10>. The second least significant count bit CN<1> is used as the most significant refresh address bit QAD<11>. The configurations of the refresh address generating unit and refresh activating circuit 7 in FIG. 13 are identical to those shown in FIG. 6, and therefore, the corresponding portions are denoted by the same reference characters and detailed description thereof is not repeated.

Figure 14:
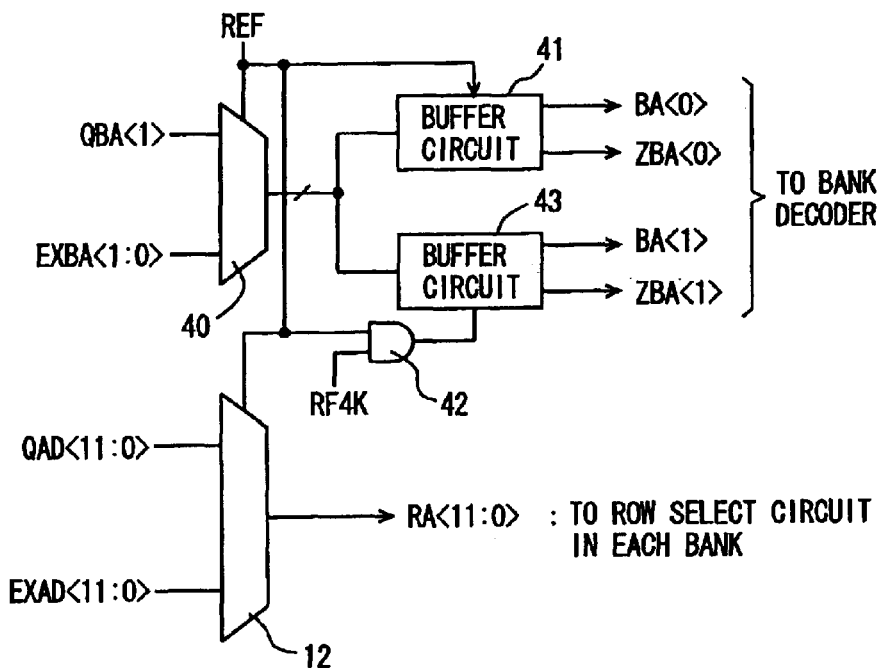
FIG. 14 schematically shows a configuration of an internal address generating unit according to the third embodiment.

FIG. 14 schematically shows a configuration of an internal address generating unit according to the third embodiment. Referring to FIG. 14, the internal address generating unit includes: a multiplexer 12 which selects one of refresh address signal QAD<11:0> and an external address signal EXAD<11:0> in accordance with refresh mode designation signal REF to generate an internal row address signal RA<11:0>; a multiplexer 40 which selects one of refresh bank address bit QBA<1> and an external bank address signal EXBA<1:0> in accordance with refresh mode designating signal REF; a buffer circuit 41 which buffers the least significant bank address bit B<0> from multiplexer 40 to generate complementary internal bank address bits BA<0> and ZBA<0>; an AND gate 42 which receives a 4K refresh designating signal RF4K and refresh mode designating signal REF; and a buffer circuit 43 which buffers a bank address signal bit supplied via multiplexer 40 upon inactivation of an output signal of AND gate 42, and generates complementary bank address signal bits BA<1> and ZBA<1>.

When refresh mode designating signal REF is in an active state, buffer circuit 41 degenerates the lower bank address bit BA<0>, and sets bank address bits BA<0> and ZBA<0> both at a selected state. Buffer circuit 43 degenerates bank address bit BA<1> when the output signal of AND circuit 42 is at an H level, and sets bank address bits BA<1> and ZBA<1> both at a selected state. When the 4K refresh cycle is designated, 4K refresh designating signal RF4K is set to an H level, and buffer circuit 43 degenerates bank address bits BA<1> and ZBA<1>. At this time, bank address bits BA<0> and ZBA<0> are also degenerated in accordance with refresh mode designating signal REF.

Thus, in the 4K refresh mode, refresh is carried out simultaneously for banks BK0–BK3. In the case where a refresh cycle other than the 4K refresh cycle is set, refresh is carried out in the refresh mode for two banks selected simultaneously in accordance with bank address bit BA<1>. Normally, this refresh mode for simultaneous refresh of two banks has an 8K refresh cycle, shorter in refresh period than the 4K refresh cycle in the normal mode, set. This is because refresh should be performed 8K times for refreshing all the rows (all the memory cells) once in the 8K refresh mode, while 4K times of refresh are required for refresh of all the memory cells in the 4K refresh mode, and the refresh intervals of the memory cells in these two refresh modes should be made equal to each other.

Figure 15:
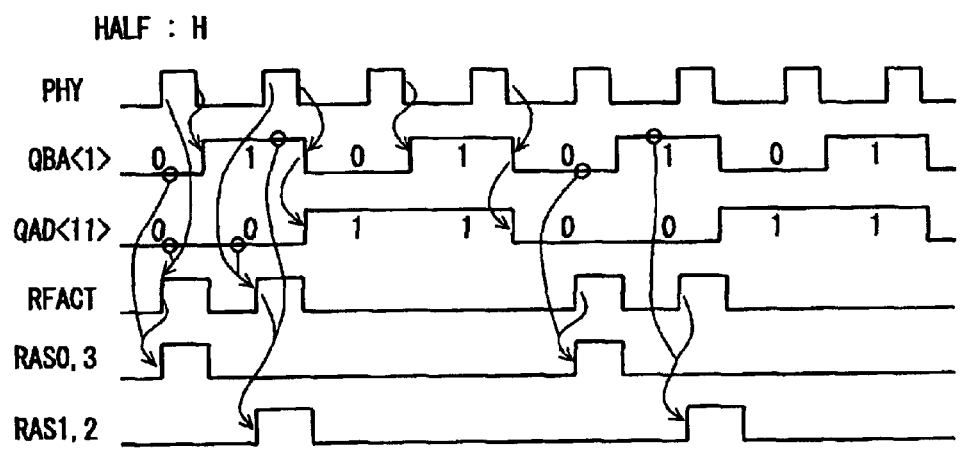
FIG. 15 is a timing chart representing a refresh operation according to the third embodiment.

FIG. 15 is a timing chart representing the bank refresh operation in the half mode according to the third embodiment. Now, the operations of the circuits shown in FIGS. 13 and 14 will be described with reference to FIG. 15. In the half mode, the refresh array activating signal is selectively activated in accordance with refresh address bit QAD<11>. Upon issuance of refresh request PHY, refresh array activating signal RFACT is activated if refresh address bit QAD<11> is "0". At this time, bank address bit QBA<1> corresponds to the least significant count bit CN<0> of refresh address counter 19, and its logical level changes at each issuance of refresh request PHY. When count bit CN<0> is "0", array activating signals RAS0 and RAS3 (RAS0, 3) for banks BK0 and BK3 are activated, and banks BK0 and BK3 are refreshed.

If refresh bank address bit QBA<1> is "1" upon activation of refresh array activating signal RFACT, array activating signals RAS1 and RAS2 (RAS1, 2) for banks BK1 and BK2 are activated. Accordingly, banks BK0 and BK3, and banks BK1 and BK2 can be refreshed alternately.

In the normal operation mode, banks BK0–BK3 are refreshed at a period twice the issuance period of refresh request PHY by the refresh timer. In the self-refresh mode, all the banks BK0–BK3 are refreshed once when refresh requests are issued four times. In this self-refresh mode, the refresh period is set twice as long as the refresh period in the normal operation mode, and the region to be refreshed in each of banks BK0–BK3 is limited to the region assigned with row address bit RA<11> of "0".

Thus, the refresh operations can be distributed on time basis in the self-refresh mode by alternately refreshing banks BK0–BK3, and the number of times of refresh in banks BK0–BK3 can also be decreased in the self-refresh mode, resulting in reduced current consumption in the respective banks.

In the 4K refresh mode, four banks BK0–BK3 are refreshed, simultaneously, at each activation of refresh array activating signal RFACT. Refresh is carried out at a period twice the refresh period in the 8K refresh mode.

In the case of the quarter mode, the least significant refresh address bit QAD<10> corresponds to refresh bank address bit QBA<1> for each of the banks. In the 8K refresh cycle, common row address regions of four quarter regions in two banks BK0 and BK3 having bank address bit QBA<1> of "0" are sequentially refreshed. In the 4K refresh cycle, since bank refresh address bit BA<1> is also degenerated, a quarter region of the entire address region in each bank is refreshed at each fourth issuance of the refresh request.

Modification

Figure 16:
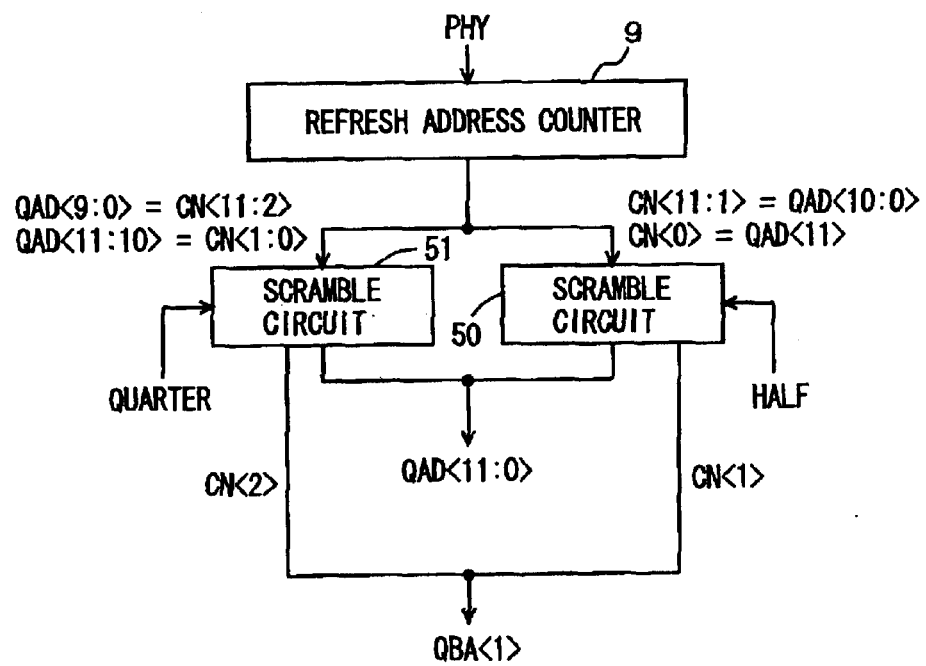
FIG. 16 schematically shows a modification of the third embodiment.

FIG. 16 schematically shows a configuration of a modification of the third embodiment of the present invention. Referring to FIG. 16, scramble circuits 50 and 51 are provided, which scramble the output count bits CN<11:0> of refresh address counter 9 in accordance with half mode designating signal HALF and quarter mode designating signal QUARTER, respectively.

Scramble circuit 50 outputs, upon activation of half mode designating signal HALF, the least significant count bit CN<0> of refresh address counter 9 as the most significant refresh address bit QAD<11>, and outputs the remaining count bits CN<11:1> as the remaining refresh address bits QAD<10:0>. Scramble circuit 50 further outputs the count bit CN<1> of refresh address counter 9 as the refresh bank address bit QBA<1> upon activation of half mode designating signal HALF.

Scramble circuit 51 outputs, upon activation of quarter mode designating signal QUARTER, the least significant two bits CN<1:0> of refresh address counter 9 as the most significant two refresh address bits QAD<11:10>, and outputs the remaining count bits CN<11:2> as refresh address bits <9:0>. Further, upon activation of quarter mode designating signal QUARTER, scramble circuit 51 selects count bit CN<2> of refresh address counter 9 as refresh bank address bit QBA<1>. The output count values of scramble circuits 50 and 51 are supplied to the refresh activating circuit shown in FIG. 13. The operation of the refresh address generating unit shown in FIG. 16 will now be described with reference to FIGS. 17 and 18.

Figure 17:
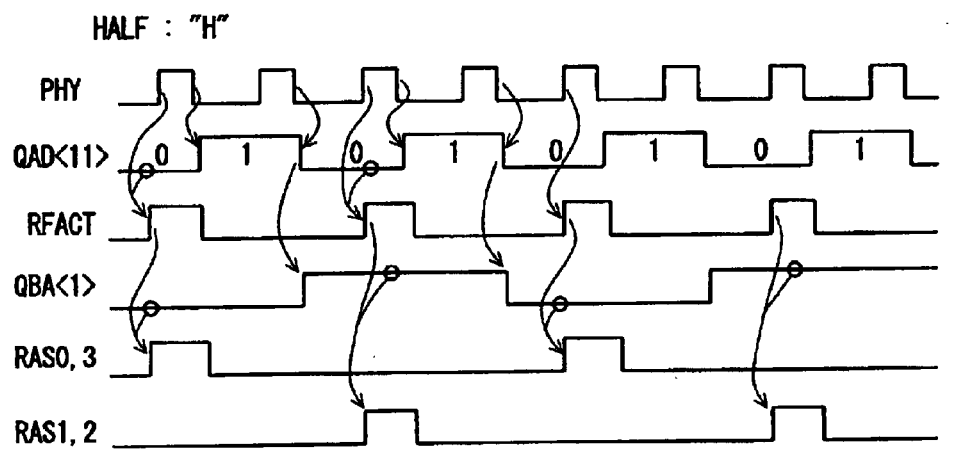
FIG. 17 is a timing chart representing an operation of the circuit shown in FIG. 16 in a half mode.

Referring first to FIG. 17, the operation in the 8K refresh cycle when the half mode designating signal HALF is set to an H level will be described first. While half mode designating signal HALF is active, most significant refresh address bit QAD<11> has its logical level changed at each issuance of refresh request PHY. At this time, refresh bank address bit QBA<1>, which is provided by count bit CN<1> of counter 9, has its logical level changed every time refresh address bit QAD<11> falls to "0". Thus, refresh array activating signal RFACT is issued at every other refresh request PHY, and a unit of two banks is designated alternately at each issuance of refresh activating signal RFACT. Accordingly, in FIG. 17, array activating signals RAS0 and RAS3 for banks BK0 and BK3 are first activated in response to refresh array activating signal RFACT, followed by activation of array activating signals RAS1 and RAS2 for banks BK1 and BK2 in response to the next refresh array activating signal RFACT. In the half mode, units of two banks are refreshed alternately at every other refresh request PHY. The current consumption at the time of refreshing is uniformly distributed and reduced in the self-refresh mode.

Figure 18:
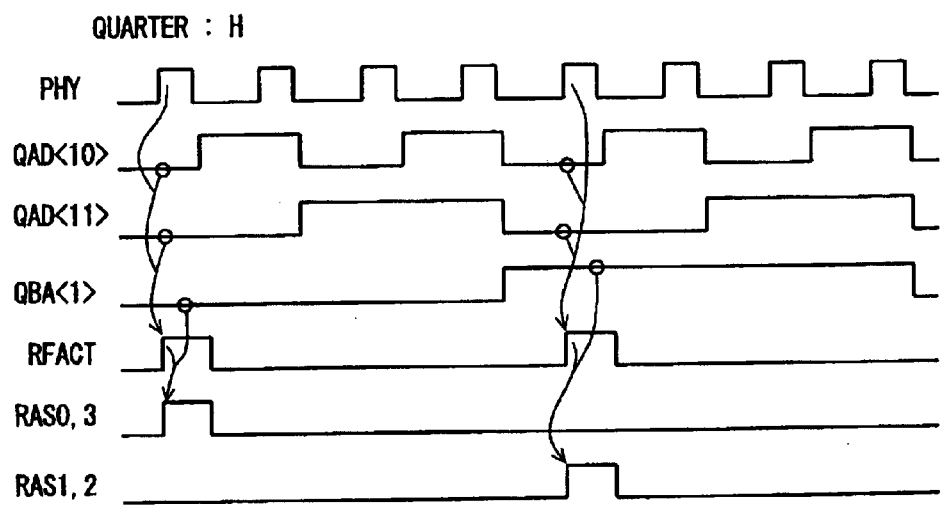
FIG. 18 is a timing chart representing the operation of the circuit shown in FIG. 16 in a quarter mode.

FIG. 18 is a timing chart representing the operation of the refresh address generating unit shown in FIG. 16 in the 8K refresh cycle of the quarter mode. Upon activation of quarter mode designating signal QUARTER, scramble circuit 51 selects least significant two bits CN<1:0> of refresh address counter 9 as upper refresh address bits QAD<11:10>, and selects lower count bit CN<2> as refresh bank address bit QBA<1>. Thus, bank address bit QBA<1> has its logical level changed every time refresh bank address signal QAD<11> falls to "0". Here, refresh address counter 9 is assumed to perform the counting operation at an increment of 1 per refresh request PHY.

The logical level of refresh address bit QAD<10> changes in response to refresh request PHY. Refresh array activating signal RFACT is activated when refresh address bits QAD<11> and QAD<10> are both at an L level. Thus, in this state, the logical level of bank address bit QBA<1> changes every fourth refresh request PHY. Accordingly, upon activation of refresh array activating signal RFACT, refresh of banks BK0 and BK3 is first carried out. Subsequently, array activating signals RAS1 and RAS2 for banks BK1 and BK2 are activated in response to the next refresh array activating signal RFACT. Banks BK0, BK3 and banks BK1, BK2 are refreshed alternately every fourth issuance of refresh request.

With the configuration as described above, refresh is performed in the self-refresh mode every time refresh request is issued a predetermined number of times, which ensures more uniform distribution of current consumption during the self-refresh mode.

In the 4K refresh cycle, bank address bit QBA<1> is degenerated, so that refresh is carried out for four banks at the same time. In this case, as well, the refresh interval in the self-refresh mode is made longer than in the normal operation mode, so that current consumption during the self-refresh mode is reduced. Further, the refresh execution cycles can be distributed on time basis in the self-refresh mode.

As described above, according to the third embodiment of the present invention, a specific address bit of the refresh address counter is employed as a bank address bit. Thus, banks can be activated alternately for refresh, and current consumption in each bank at the time of refresh can be made uniform on the time basis in the self-refresh mode.

The memory array may be divided into any number of banks besides four as in the description above. A count bit upper by one bit than the refresh address bit employed for thinning out the refresh array activating signal is utilized as the refreshing bank address bit, which enables alternate refreshing of banks at an increased refresh interval in the self-refresh mode. The intervals of the refresh execution cycles are also made uniform.

In the configuration described above, refresh array activating signal RFACT is issued commonly to banks BK0–BK3, and array activating signal RAS is generated at each bank in accordance with a bank address bit. Alternatively, a separate refresh activating circuit may be placed in the respective banks to internally generate the array activating signal in accordance with an upper bit of the refresh address and a refresh request.

Fourth Embodiment

Figure 19:
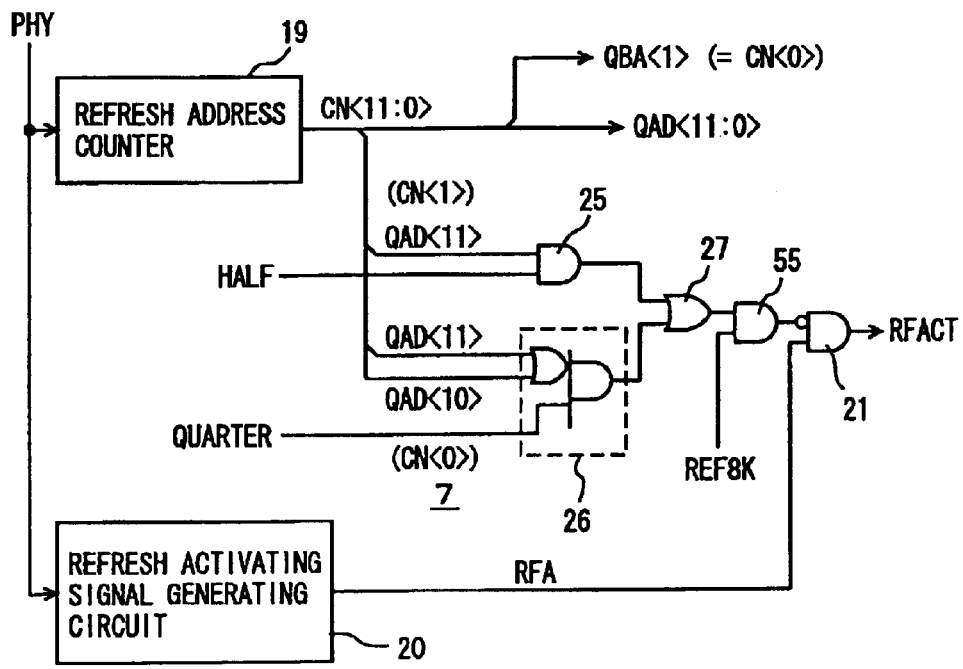
FIG. 19 schematically shows configurations of a refresh address generating unit and a refresh activating circuit according to a fourth embodiment of the present invention.

FIG. 19 schematically shows a configuration of the refresh activating circuit according to the fourth embodiment of the present invention. The refresh activating circuit 7 shown in FIG. 19 includes an AND gate 55 which receives the output signal of OR gate 27 and an 8K refresh cycle designating signal REF8K and applies the output signal to a false input of gate circuit 21. The configuration of the refresh activating circuit of FIG. 19 is otherwise identical to that of the refresh activating circuit shown in FIG. 13, and therefore, the corresponding portions are denoted by the same reference characters and detailed description thereof will not be repeated.

The refresh period in the 8K refresh cycle is made shorter than the refresh period of the 4K refresh cycle in the normal operation mode. For example, if the refresh interval in the 4K refresh cycle is 16 $\mu$s, the refresh interval in the 8K refresh cycle is 8 $\mu$s. Thus, the AND circuit 55 is employed when refresh of a memory cell at every 16 $\mu$s is requested even in the self-refresh mode. The issuance period of refresh array activating signal RFACT is lengthened only when the 8K refresh cycle is designated.

When the 4K refresh cycle is designated, 8K refresh cycle designating signal REF8K is at an L level. Gate circuit 21 generates refresh array activating signal RFACT in accordance with activation control signal RFA from refresh activating signal generating circuit 20. The issuance period of refresh request PHY is the same as the refresh interval in the normal operation mode. Thus, it is only at the 8K refresh cycle in the self-refresh mode where refresh is carried out at an interval longer than the refresh cycle in the normal operation mode.

Modification

Figure 20:
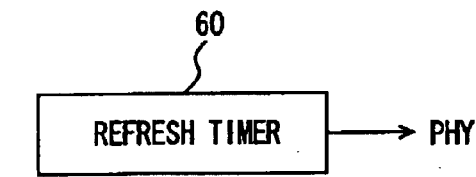
FIG. 20 schematically shows a modification of the fourth embodiment.

FIG. 20 schematically shows a configuration of the main portion of the modification of the fourth embodiment. Referring to FIG. 20, the refresh timer 60 issues the refresh request in the 4K refresh cycle and the 8K refresh cycle at the same refresh periods. Accordingly, this refresh timer 60 issues refresh request PHY in the self-refresh mode at a refresh interval twice the refresh interval in the normal operation mode if the 8K refresh cycle is designated. In the 4K refresh cycle as well, refresh timer 60 issues refresh request PHY at the same interval as the refresh interval in the normal operation mode. Thus, in this case, the self-refresh interval can be lengthened in the self-refresh mode as compared to that in the normal operation mode.

In the quarter mode, the refresh interval is set four times as long as the refresh interval in the normal operation mode. Thus, in this case, the issuance period of refresh requests PHY of refresh timer 60 may be reduced to half a times in accordance with quarter mode designating signal QUARTER. Refresh can be carried out in the half mode and the quarter mode at the same intervals.

As described above, according to the fourth embodiment of the present invention, the refresh interval is selectively set in accordance with a designated refresh cycle mode. The refresh interval in the self-refresh mode can be optimized in accordance with the retention characteristics of storage data of the memory cells. Accordingly, a current consumed in refreshing in the self-refresh mode can be reduced, while reliably retaining the stored data.

Although an operation mode is designated with a command in the above description, the present invention is applicable to any semiconductor memory device with a self-refresh mode in which refresh is carried out internally and automatically.

As described above, according to the present invention, the refresh operation is activated in accordance with a specific refresh address bit and a refresh request. The refresh interval can be lengthened, and current consumption during the refresh mode can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device requiring periodic refreshing of storage data, comprising:
   refresh address generating circuitry for generating a multi-bit refresh address designating a memory cell to be refreshed; and
   refresh activating circuitry for generating a refresh array activating signal for activating a refresh operation in accordance with a specific address bit of at least one bit of the refresh address and a refresh request requesting a refreshing of storage data.

2. The semiconductor memory device according to claim 1, wherein said refresh address generating circuitry comprises a refresh counter for performing a counting with an upper address bit of said refresh address being a lower count bit, and said specific address bit comprises said upper address bit.

3. The semiconductor memory device according to claim 2, wherein said specific address bit comprises a most significant refresh address bit, and said refresh counter performs a counting with said most significant refresh address bit being a least significant count bit.

4. The semiconductor memory device according to claim 2, wherein said specific address bit of at least one bit comprises a plurality of most significant refresh address bits, and said refresh counter performs a counting with said plurality of most significant refresh address bits being least significant count bits.

5. The semiconductor memory device according to claim 2, further comprising a plurality of banks each activated independently from each other in a normal operation mode, wherein
   a prescribed lower bit of said refresh counter is employed as a bank address bit for identifying a bank in the banks in a refresh mode for carrying out said refresh.

6. The semiconductor memory device according to claim 5, wherein the bank address bit for identifying said bank and said specific bit comprises different lower count bits of said refresh counter, respectively.

7. The semiconductor memory device according to claim 2, wherein said refresh activating circuitry generates said refresh array activating signal in accordance with a most significant bit of said refresh address and said refresh request in a first refresh mode, and generates said refresh array activating signal in accordance with a plurality of upper bits of said refresh address and said refresh request in a second refresh mode, said plurality of upper bits of said refresh address being provided by a plurality of lower bits of a count value of said refresh counter.

8. The semiconductor memory device according to claim 1, wherein said refresh activating circuitry stops activation of said refresh array activating signal when said specific address bit is at a predetermined logical level.

9. The semiconductor memory device according to claim 1, further comprising a plurality of banks each activated independently from each other in a normal operation mode, wherein said specific address bit of at least one bit of said refresh address is employed as a bank address bit for designating a bank of the banks in a refresh mode for carrying out said refresh.

10. The semiconductor memory device according to claim 9 wherein said bank address bit comprises one bit.

11. The semiconductor memory device according to claim 1, further comprising refresh request generating circuitry for, in a refresh mode of internally carrying out said refresh, generating said refresh request at a period identical to an issuance period of an externally issued refresh request in a first refresh mode, and generating said refresh request at a period longer than the issuance period of said externally issued refresh request in a second refresh mode.

12. The semiconductor memory device according to claim 11, wherein said refresh request generating circuitry generates said refresh request at a common period in said first refresh mode and said second refresh mode.

\* \* \* \* \*